(12) United States Patent
Wan et al.

(10) Patent No.: US 10,840,267 B2
(45) Date of Patent: Nov. 17, 2020

(54) ARRAY SUBSTRATES AND MANUFACTURING METHODS THEREOF, AND DISPLAY PANELS

(71) Applicant: Yungu (Gu'an) Technology Co., Ltd., Langfang (CN)

(72) Inventors: Kang Wan, Langfang (CN); Feng Yu, Langfang (CN); Yang Li, Langfang (CN)

( * ) Notice: Subject to any disclaimer, the term of this patent is extended or adjusted under 35 U.S.C. 154(b) by 0 days.

(21) Appl. No.: 16/388,875

(22) Filed: Apr. 19, 2019

(65) Prior Publication Data

US 2019/0252415 A1 Aug. 15, 2019

Related U.S. Application Data

(63) Continuation of application No. PCT/CN2018/116046, filed on Nov. 16, 2018.

(30) Foreign Application Priority Data

May 14, 2018 (CN) .......................... 2018 1 0455003

(51) Int. Cl.
*H01L 27/12* (2006.01)
*H01L 27/32* (2006.01)
(Continued)

(52) U.S. Cl.
CPC ...... *H01L 27/1218* (2013.01); *H01L 27/1262* (2013.01); *H01L 27/3246* (2013.01); *H01L 51/0097* (2013.01); *H01L 51/5256* (2013.01)

(58) Field of Classification Search
CPC ............. H01L 27/1218; H01L 27/1262; H01L 27/3246; H01L 51/0097; H01L 51/5256
(Continued)

(56) References Cited

U.S. PATENT DOCUMENTS

2006/0132461 A1* 6/2006 Furukawa ........... H01L 27/3274
345/173
2009/0273589 A1* 11/2009 Asano ................. H01L 27/3246
345/204
(Continued)

FOREIGN PATENT DOCUMENTS

CN 105226079 A 1/2016
CN 107658332 A 2/2018
(Continued)

OTHER PUBLICATIONS

Machine English Translation of Chinese Patent No. CN 108428728 (Year: 2018).*
(Continued)

*Primary Examiner* — Dzung Tran
(74) *Attorney, Agent, or Firm* — Kilpatrick Townsend & Stockton LLP

(57) ABSTRACT

According to an embodiment, the present invention provides an array substrate that includes a base substrate and a number of film layers provided on the base substrate. The base substrate is provided with an installation slot that provides an installation space for a hardware structure. A packaging-reserved slot is defined in a number of film layers and extending through at least a part of the film layers. The installation slot extends through the base substrate in a thickness direction of the array substrate, and the packaging-reserved slot surrounds the installation slot.

7 Claims, 4 Drawing Sheets

(51) Int. Cl.
  *H01L 51/52* (2006.01)
  *H01L 51/00* (2006.01)
(58) Field of Classification Search
  USPC .......................................................... 257/40
  See application file for complete search history.

(56) References Cited

U.S. PATENT DOCUMENTS

| | | | | |
|---|---|---|---|---|
| 2013/0157396 A1* | 6/2013 | Ryu | ................ | H01L 51/5237 |
| | | | | 438/28 |
| 2014/0097430 A1* | 4/2014 | Park | ................ | H01L 27/1218 |
| | | | | 257/48 |
| 2014/0131683 A1* | 5/2014 | Kim | ................ | H01L 51/5253 |
| | | | | 257/40 |
| 2016/0013253 A1* | 1/2016 | Lee | ................ | H01L 27/3244 |
| | | | | 257/40 |
| 2017/0369999 A1 | 12/2017 | Lee | | |

FOREIGN PATENT DOCUMENTS

| | | | |
|---|---|---|---|
| CN | 108428728 | A | 8/2018 |
| JP | 2007073285 | A | 3/2007 |
| TW | 201808840 | A | 3/2018 |

OTHER PUBLICATIONS

English Machine Translation of WO 2017204055 (A1) (Year: 2017).*
English Machine Translation of Chinese Patent No. CN 107658332. (Year: 2018).*

* cited by examiner

ARRAY SUBSTRATES AND MANUFACTURING METHODS THEREOF, AND DISPLAY PANELS

CROSS REFERENCE TO RELATED APPLICATIONS

This application is a continuation application for International Application PCT/CN2018/116046, filed on Nov. 16, 2018, which claims priority to Chinese Patent Application No. 201810455003.2, entitled "ARRAY SUBSTRATES AND MANUFACTURING METHODS THEREOF, DISPLAY PANELS AND MANUFACTURING METHODS THEREOF, AND DISPLAY DEVICES" filed on May 14, 2018, the contents of which are expressly incorporated by reference herein in their entireties.

FIELD

The present disclosure relates to displays, and in particular, relates to array substrates and manufacturing methods thereof, and display panels.

BACKGROUND

In recent years, with the development of technologies of intelligent terminal devices and wearable devices, the demand for flat panel displays has been increasingly diversified. For example, an Organic Light-Emitting Diode (OLED) display has self-luminous capability, and a backlight module that is relatively energy-consuming is omitted compared to a liquid crystal display, and thus has an advantage of more energy saving. In addition, compared with conventional flat panel displays, OLED displays have the advantages of flexibility, so they are widely used in smart terminal products such as a mobile phone and a tablet computer.

SUMMARY

According to various embodiments of the disclosure, array substrates and manufacturing methods thereof, and display panels are provided.

An array substrate, includes: a base substrate including an installation slot thereon providing an installation space for a hardware structure, the installation slot extending through the base substrate in a thickness direction of the array substrate; and a plurality of film layers provided on the base substrate and including a packaging-reserved slot thereon extending through at least a part of the film layers, the packaging-reserved slot surrounding the installation slot.

A manufacturing method of an array substrate, includes: providing a base substrate including a slotted region thereon; forming a plurality of film layers on the base substrate; defining an installation slot in the slotted region to provide an installation space for a hardware structure, the installation slot extending through the base substrate in a thickness direction of the base substrate; and removing at least a part of the film layers to form a packaging-reserved slot surrounding the installation slot.

A display panel, includes: an array substrate, the array substrate including: a base substrate including an installation slot thereon providing an installation space for a hardware structure, the installation slot extending through the base substrate in a thickness direction of the array substrate; and a plurality of film layers provided on the base substrate and including a packaging-reserved slot thereon extending through at least a part of the film layers, the packaging-reserved slot surrounding the installation slot; an organic light-emitting unit formed on the array substrate and located outside the installation slot and the packaging-reserved slot; and a package layer formed on a side of the organic light-emitting unit away from the array substrate; and a packaging material with a preset thickness is provided in the packaging-reserved slot, the packaging material covers at least the organic light-emitting unit adjacent to an edge of the installation slot.

A manufacturing method of a display panel, includes: providing an array substrate, the array substrate including: a base substrate including an installation slot thereon providing an installation space for a hardware structure, the installation slot extending through the base substrate in a thickness direction of the array substrate; and a plurality of film layers being provided on the base substrate and including a packaging-reserved slot thereon extending through at least a part of the film layers, the packaging-reserved slot surrounding the installation slot; forming an organic light-emitting unit outside the installation slot and the packaging-reserved slot on the array substrate; forming a package layer on a side of the organic light-emitting unit away from the array substrate; and filling a packaging material with a preset thickness in the packaging-reserved slot, the packaging material covering at least the organic light-emitting unit adjacent to an edge of the installation slot.

A display device, includes the foregoing display panel.

Details of one or more embodiments of the disclosure will be introduced in the drawings and descriptions as follows. And other characteristics, purposes and advantages of the present disclosure will be apparent from the specification, drawings and appended claims.

DETAILED DESCRIPTION OF THE EMBODIMENTS

Figure 1:
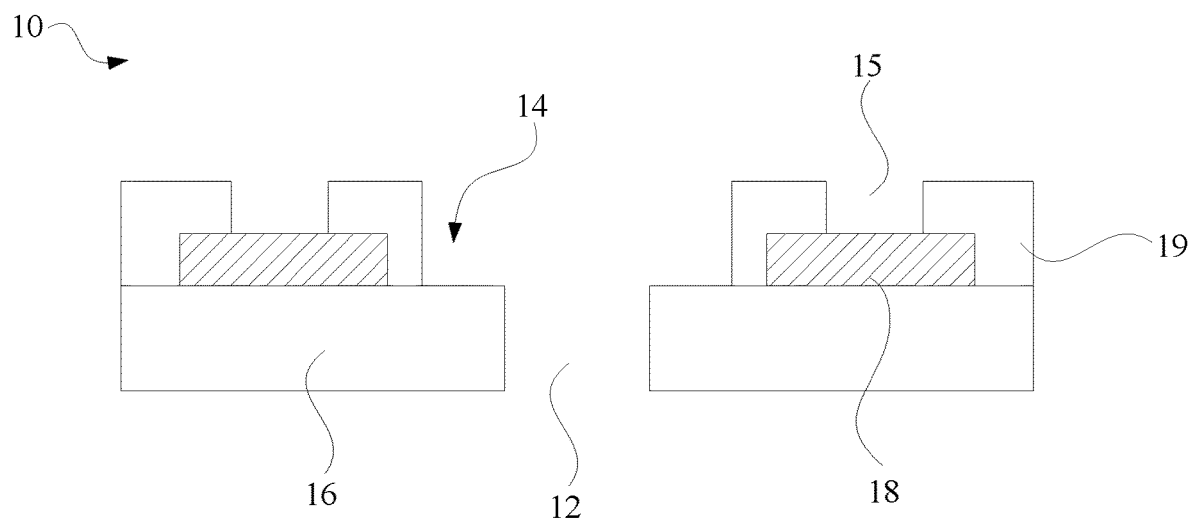
FIG. 1 is a cross-sectional view of an array substrate according to an embodiment.

The present disclosure will be described in details in combination with the accompanying drawings. Alternative embodiments are given in the drawings. However, the present disclosure can be implemented in various forms and is not restricted to the embodiments described herein. In contrary, the particular embodiments are described for the purpose of comprehending the present disclosure more fully and completely.

As OLED displays are easy to be customized in appearance, more and more terminal manufacturers are applying them to full screen and frameless products. However, full screen and frameless products require a larger light-emitting area, and therefore, in practical applications, it is often desirable to provide installation slots on OLED displays, so as to reserve the installation position of hardware such as a front camera or receiver on the terminal equipment.

At present, an package of an OLED display device mainly includes a cover plate package and a thin film package. The thin film package is packaging OLED devices by stacking an organic thin film layer and an inorganic thin film layer, which is often used in packaging flexible OLED display devices. For the display panel provided with the installation slot, laser cutting needs to be performed on the display panel after the packaging is completed to expose the installation slot and cut the display panel from a motherboard. The cutting method of the motherboard is usually a knife wheel cutting or laser cutting. In order to meet the diversified demands of the market in terms of the shape and realize a narrow frame as much as possible, the laser cutting is widely used in the cutting of flexible products because of its high energy, good unidirectionality and higher efficiency than that of the knife wheel.

However, in the laser cutting process, the film material and the substrate are damaged by the cutting heat, and the heat effect is more significant especially in the abnormity cutting than that in the straight cutting. As such, the OLED light-emitting layer and the packaging structure at the edge of the slotted region are easily damaged, so that the device is damaged and the packaging is unfavorable, and the display at the edge of the slotted region is abnormal.

In the prior production and manufacture of display panels, in order to reduce manufacturing costs and enable a large-scale batch production, it is common to fabricate a plurality of display panels on one large display panel motherboard, and then, through a cutting process, the relatively large display panel motherboard is cut into several display panel single bodies. In general, the display panel motherboard includes a motherboard body and a packaging structure layer provided on the motherboard body. The motherboard body has a plurality of display panels, each of which is provided with an OLED device. The packaging structure layer includes a plurality of packaging structures corresponding to the plurality of display panels one by one, and each packaging structure is used to packaging the OLED device in a corresponding display panel.

In the development direction of narrow frames of the display panels, as the frame of the display panel is increasingly narrowed, the shortest distance between the position of a cutting line on the motherboard of the display panel and the packaging boundary of the display element is increasingly decreased. In the practical application process, it is usually required to provide an installation slot on the display panel to reserve an installation position of hardware such as a front camera, a receiver, a start key, or a speaker on a terminal device. Currently, the installation slot is generally provided in a non-display region outside the effective display region, which limits the area of the effective display region, thereby failing to achieve the effect of "full screen" or "narrow frame". Therefore, it is necessary to define an installation slot in the display region.

The principle of laser cutting is to cut a film layer by thermal melting. As an example, a substrate of a flexible display panel is usually made of a resin material, and a package layer structure of that is a thin film package layer formed of an inorganic layer and an organic layer. Due to a large thermal expansion coefficient of the resin material, in the laser cutting process, an edge of the substrate of the flexible display panel absorbs a large amount of heat and expands, causing damage to elements around the display region and abnormal display around the display panel. The edge of the thin film package layer also absorbs a large amount of heat and has damage such as thermal expansion or tearing, causing moisture to permeate from the side of the display panel, thereby damaging an organic light-emitting unit, such that the display panel cannot provide a long-term excellent display performance.

Therefore, it is necessary to provide an array substrate and a manufacturing method thereof whereby the organic light-emitting unit at the edge of the slotted region will not be damaged in the process of laser cutting and slotting.

Before detailed description of the present disclosure, some terms are first explained so as to facilitate a clearer understanding of the technical solution of the present disclosure.

Array substrate, i.e., a Thin-Film Transistor (TFT) array substrate, refers to a base substrate on which at least a TFT array, an anode, and a pixel defining layer are formed.

Installation slot: an area for installation hardware structure. For the purpose of explanation, this area is herein named as installation slot, but the name is not limited to this application. Other names, such as a through hole, a groove, an installation hole, etc., may also be used as desired. In one or more embodiments, the hardware structure includes one or more structures of a front camera, a start key, an receiver, or a speaker. The specific installation mode of the hardware structure is not limited herein. In addition, when cutting the installation slot, a shape of the installation slot cut is determined according to the hardware structure to be mounted. Installation slots of different shapes may be provided for different hardware configurations. In one or more embodiments, the cross-sectional shape of the installation slot in a direction parallel to the base substrate is one or more of a circle, an ellipse, a rectangle, a trapezoid, a rhombus, or a square.

It should be understood that the display panels provided in the embodiments of the present disclosure are mainly applied to a full-screen or frameless display panel, and may also be applied to a conventional display panel having a frame or a narrow frame.

FIG. 1 shows a cross-sectional view of an array substrate 10 according to an embodiment. The array substrate 10 includes a base substrate 16 and a plurality of film layers. The base substrate 16 is provided with an installation slot 12 to provide an installation space for the hardware structure, and the plurality of film layers are provided with a packaging-reserved slot 14 extending through at least a part of the film layers of the array substrate 10. The installation slot 12 extends through the base substrate 16 in a thickness direction of the array substrate 10, and the packaging-reserved slot 14 is defined surrounding the installation slot 12.

The packaging-reserved slot 14 may be defined surrounding the installation slot 12 along a boundary of the installation slot 12, or may be defined surrounding the installation slot 12 at a distance from the installation slot 12. For example, in some embodiments, an interval region is defined between the installation slot 12 and the packaging-reserved slot 14 to avoid affecting the film layers of the array substrate 10 during laser cutting and slotting.

The array substrate 10 includes a display region and a frame region. In order to effect a "full screen" or "narrow frame", the installation slot 12 may be defined in the display region. Of course, the installation slot 12 may also be provided in the frame region, or across the display region and the frame region, and is not limited thereto.

The packaging-reserved slot 14 is used for configuring a package layer material with a preset thickness. It should be understood that since an organic light-emitting material layer is very sensitive to external environment such as water vapor and oxygen, if the organic light-emitting material layer in the display panel is exposed to an environment having water vapor or oxygen, the performance of the display panel may be drastically decreased or completely damaged. Therefore, in one or more embodiments, the package layer material in the packaging-reserved slot 14 should cover at least sides of an organic light-emitting unit so as to cooperate with the package layer to ensure that the organic light-emitting material layer or the like in the organic light-emitting unit is not invaded by outside environment.

The preset thickness refers to a thickness of the package layer material provided in the packaging-reserved slot 14 in the thickness direction of the array substrate 10. Specifically, in the embodiment shown in FIG. 1, the preset thickness refers to the thickness of the packaging material provided in the packaging-reserved slot 14 in the up-down direction.

Figure 3:
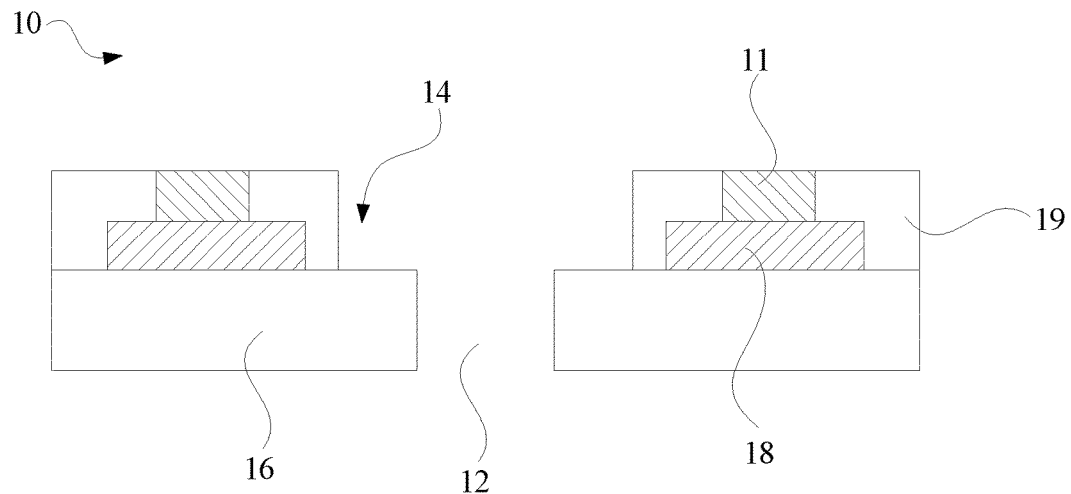
FIG. 3 is a cross-sectional view of a display panel without a package layer according to an embodiment.
Figure 4:
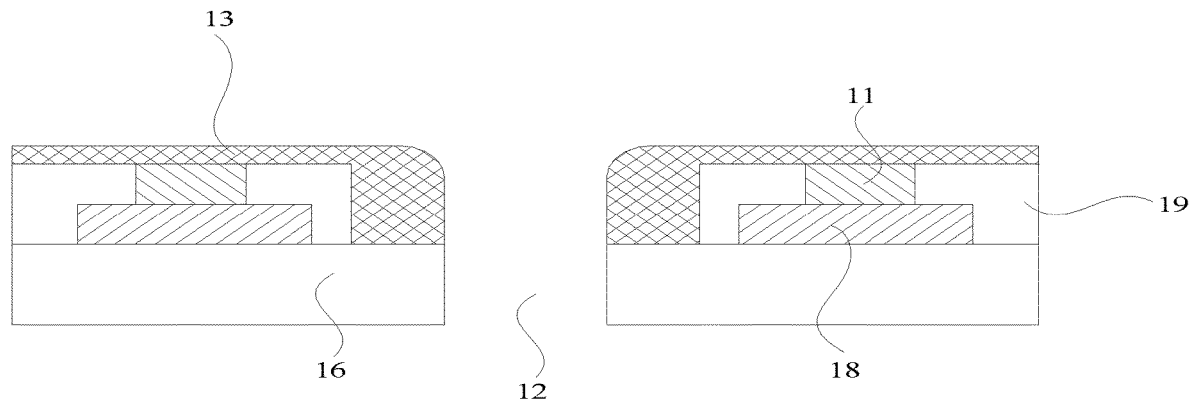
FIG. 4 is a cross-sectional view of the display panel shown in FIG. 3 with a package layer.

Referring to FIGS. 1, 3 and 4, before the organic light-emitting unit 11 is deposited on the array substrate 10, cutting and slotting are performed on the array substrate 10 provided in the embodiment so as to prevent the organic light-emitting unit 11 from being damaged by the cutting heat, the production yield of the display panel is thereby improved. In addition, evaporation and thin film packaging of the organic light-emitting unit 11 are performed after cutting and slotting, so that an edge of the package layer 13 is prevented from absorbing a large amount of heat and having damage such as expansion or tearing in the subsequent cutting process, thereby preventing the organic light-emitting unit 11 from being invaded by air or water vapor outside the closed space, and a display effect and service life of the display panel are improved.

In addition, the array substrate 10 is provided with the packaging-reserved slot 14, so that the package layer material can cover at least the sides of the organic light-emitting unit 11, so as to cooperate with the package layer 13 to ensure that the organic light-emitting unit 11 is not invaded and damaged, thereby further improving the packaging reliability of the display panel.

In some embodiments, the array substrate 10 includes a base substrate 16, a thin film transistor disposed on the base substrate 16, and an anode 18 and a functional film layer provided on the thin film transistor. The installation slot 12 extends through the base substrate 16 and each of the film layers of the array substrate 10 in the thickness direction of the base substrate 16, and the packaging-reserved slot 14 extends through at least the functional film layer. The functional film layer includes at least a pixel defining layer 19. As such, it is possible to further ensure that the organic light-emitting material layer or the like in the organic light-emitting unit 11 is not invaded by outside environment. Of course, the array substrate 10 may further include a planarization layer, a passivation layer, or the like, and is not limited herein. In this disclosure, since the installation slot 12 can be defined in the display region, the frame can be reduced, the display area of the display region can be increased, and the production of the "full screen" or "narrow frame" can be realized.

The array substrate 10 provided in this embodiment is provided with a packaging-reserved slot 14 at an edge of the installation slot 12 to accommodate the package layer material with the preset thickness. It is understandable that, in order to ensure a packaging effect, a width of the packaging-reserved slot 14 should be within a reasonable range to protect the organic light-emitting material layer and an cathode layer from being oxidized by outside water and oxygen, so that the reliability at the position of the installation slot 12 is improved.

The inventors of the present disclosure have found that in order to ensure a good packaging effect and to provide the edge of the installation slot 12 with a favorable display effect, the thickness of the package layer material covering the sides of the organic light-emitting unit 11 and the functional film layer in a width direction of the packaging-reserved slot 14 should be kept within a reasonable range. Further, the edge of the installation slot 12 and a boundary of adjacent functional film layer of the installation slot 12 define the packaging-reserved slot 14, a shortest distance between the edge of the installation slot 12 and the boundary of the functional film layer adjacent to the installation slot 12 is the very width of the packaging-reserved slot 14, and the width of the packaging-reserved slot 14 determines the thickness of the package layer material that is subsequently coated on the side surfaces of the organic light-emitting unit 11 and the functional film layer in the width direction of the packaging-reserved slot 14. The inventors of the present disclosure have found that when the shortest distance between the edge of the installation slot 12 and the boundary of the functional film layer adjacent to the installation slot 12 is substantially 80 μm to substantially 150 μm, the package layer material located in the packaging-reserved slot 14 can perform effective packaging and protect the organic light-emitting unit 11, and the problem that the display at the edge of the installation slot 12 is unfavorable due to the excessive thickness of the package layer material in the width direction of the packaging-reserved slot 14 is avoided.

In an embodiment, the thickness of the package layer material covering the sides of the organic light-emitting unit 11 and the functional film layer in the width direction of the packaging-reserved slot 14 should be substantially 100 μm. Therefore, the shortest distance between the edge of the installation slot 12 and the boundary of the functional film layer adjacent there to the installation slot 12 should be substantially 100 μm.

It should be noted that the width of the packaging-reserved slot 14 refers to the shortest distance between the edge of the installation slot 12 and the boundary of the functional film layer adjacent to the installation slot 12. Specifically, in the embodiment shown in FIG. 1, the width direction of the packaging-reserved slot 14 refers to the left-right direction as shown in FIG. 1.

Figure 2:
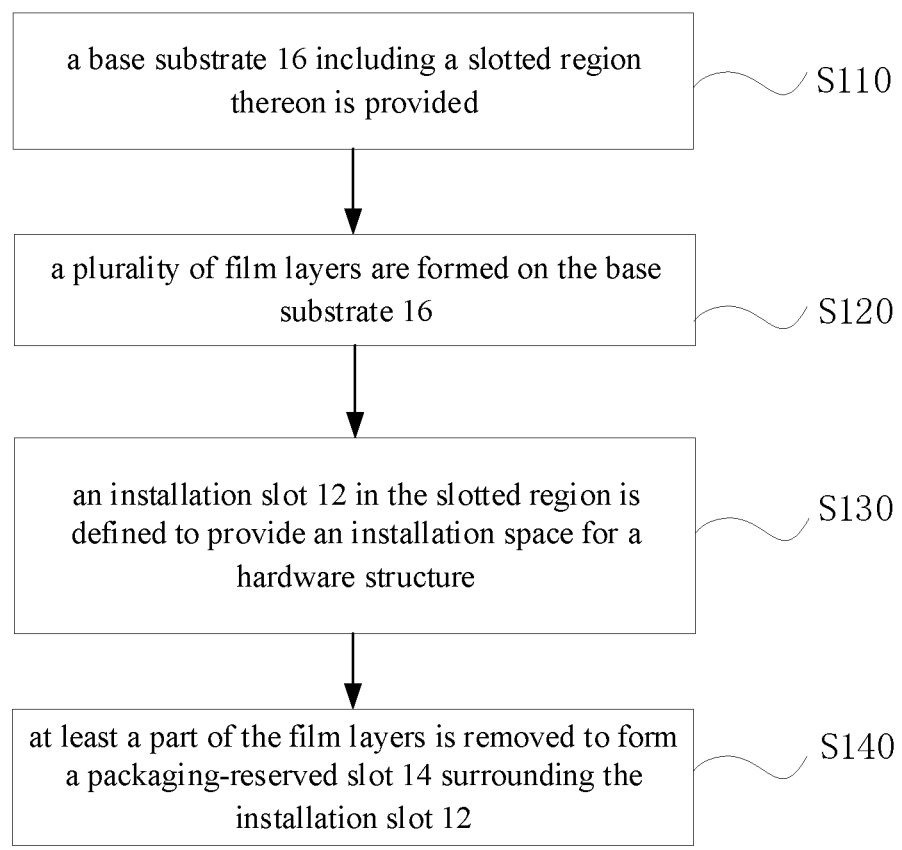
FIG. 2 is a flowchart of a manufacturing method of an array substrate according to an embodiment.

For the purpose of further understanding of the technical solution of the present disclosure, embodiments of the present disclosure also provide a manufacturing method of the array substrate. FIG. 2 is a flowchart of a manufacturing method of an array substrate according to an embodiment.

As shown in FIG. 2, a manufacturing method of an array substrate provided in an embodiment includes:

In step S110, a base substrate 16 including a slotted region thereon is provided.

The base substrate 16 is formed on a carrier substrate. The base substrate 16 is a flexible substrate, optionally made of organic polymer, silicon nitride, and silicon oxide, the organic polymer may be one of polyimide, polyamide, polycarbonate, polyphenylene ether sulfone, and the like. In some embodiments, the base substrate 16 may be obtained by coating a polyimide paste on the carrier substrate and then curing the polyimide.

In step S120, a plurality of film layers are formed on the base substrate 16.

Specifically, a thin film transistor and a functional film layer are sequentially formed on the base substrate 16. The functional film layer includes at least a pixel defining layer 19. In specific implementation, in addition to forming the thin film transistor, a anode 18, an organic light-emitting material layer, and a cathode layer on the base substrate 16, it is necessary to form other film layers, for example, a passivation layer, a planarization layer, and the like.

It should be understood that specific process of forming each of the film layers on the base substrate 16 is not limited in the embodiments of the present disclosure, and an appropriate process may be selected as needed.

In step S130, an installation slot 12 in the slotted region is defined to provide an installation space for a hardware structure.

The installation slot 12 extends through the base substrate 16 in an thickness direction of the array substrate 10. In some embodiments, the installation slot 12 extends through the base substrate 16 and the described film layers.

Specifically, the base substrate 16 and each of the film layers of the array substrate 10 are cut off in the thickness direction of the array substrate 10 along a boundary of the slotted region by a laser cutting process. The shape of the installation slot 12 is the same as that of the slotted region, and an orthographic projection of the installation slot 12 on the base substrate 16 coincides with an orthographic projection of the slotted region on the base substrate 16.

It will be appreciated that the fabrication of some of the film layers in the slotted regions may be omitted, e.g., using a patterning or etching process to remove, for example, the anode 18, the pixel defining layer 19 and the like, since each of the film layers in the slotted region needs to be cut off to form the installation slot 12.

In step S140, at least a part of the film layers is removed to form a packaging-reserved slot 14 surrounding the installation slot 12.

In particular, a preset region may be first selected. The shape of the preset region is the same as that of the slotted region, at least is a relatively similar pattern. And the pattern size of the preset region is larger than that of the slotted region. Then, the packaging-reserved slot 14 is cut or etched along the boundary line of the preset region. Of course, the corresponding film layers in the slotted region can also be removed.

In some embodiments, a hollow pattern through the functional layer is formed in the functional layer to form the packaging-reserved slot 14.

In some embodiments, an additional layer, such as a buffer layer, may be formed on the base substrate 16 prior to forming the thin film transistor. The buffer layer may be formed on the entire surface of the base substrate 16 or may be formed by patterning.

The buffer layer may have a layered structure which is formed in a manner of a single layer or a multilayer stack and made of a suitable material among materials such as PET, PEN, polyacrylate and/or polyimide. The buffer layer may also be made of silicon oxide or silicon nitride, or may include a composite layer including an organic material layer and/or an inorganic material layer.

The thin film transistor is formed on the base substrate 16. The thin film transistor may control an emission of each sub-pixel, or may control the amount of an emission when each sub-pixel emits light. The thin film transistor may include a semiconductor layer, a gate electrode, a source electrode, and a drain electrode. The semiconductor layer may be formed of an amorphous silicon layer, a metal oxide, or a polysilicon layer, or may be formed of an organic semiconductor material. In some embodiments, the semiconductor layer includes a trench region, and a source region and a drain region which are doped with dopants.

The semiconductor layer may be covered with a gate insulating layer, and the gate electrode may be provided on the gate insulating layer. In general, the gate insulating layer may cover the entire surface of the base substrate. In some embodiments, the gate insulating layer may be formed by patterning. The gate insulating layer may be made of silicon oxide, silicon nitride, or other insulating organic or inorganic material in consideration of adhesion with an adjacent layer, formability of a stacked target layer, and surface flatness. The gate electrode may be covered with an interlayer insulating layer formed of silicon oxide, silicon nitride, and/or other suitable insulating organic or inorganic material. A part of the gate insulating layer and the interlayer insulating layer may be removed, and a contact hole is formed after the removal to expose a preset region of the semiconductor layer. The source electrode and the drain electrode may contact the semiconductor layer via the contact hole.

Since the thin film transistor has a complex layer structure, and the top surface thereof may not be flat, in some embodiments, the thin film transistor further includes a planarization layer to form a sufficiently flat top surface. After the planarization layer is formed, through-holes may be formed in the planarization layer to expose the source electrode and the drain electrode of the thin film transistor.

In some embodiments, the functional film layer includes a pixel defining layer 19. The anode is the pixel electrode including a plurality of sub-pixel electrodes corresponding to sub-pixel regions, and the plurality of sub-pixel electrodes are formed on the planarization layer. It will be readily appreciated that the plurality of sub-pixel electrodes are electrically connected to the thin film transistor through the described through-holes, and the sub-pixel electrodes are generally referred to as the anode 18. The pixel defining layer 19 covers a plurality of sub-pixel electrodes and has corresponding sub-pixel openings to define sub-pixels. For example, the pixel defining layer 19 may be formed of a single material layer or a composite material layer including a suitable inorganic material or a suitable organic material such as polyacrylate, polyimide, or the like. In specific embodiment, the pixel defining layer 19 may expose a central part of each sub-pixel electrode through a patterning process.

It should be noted that, in order to reserve the packaging-reserved slot 14 at the edge of the installation slot 12 to provide a covering space for the package layer material after the installation slot 12 is cut, and that the packaging-reserved slot 14 extends through the functional film layer, the process has to be improved. For example, while the pixel defining layer 19 is formed, the pixel defining layer 19 may be patterned to have a hollow pattern, thereby forming the packaging-reserved slot 14. That is, the array substrate 10 as shown in FIG. 1 may be finally obtained.

In the manufacturing method of the array substrate provided in this embodiment, laser cutting and slotting are performed before evaporation of the organic light-emitting unit on the array substrate, which can avoid the organic light-emitting unit being damaged by the cutting heat, and improve the production yield of the display panel. In addition, while forming the film layer of the array substrate, the corresponding film layer can be removed by patterning and hollowing process to form the packaging-reserved slot 14, so that the cutting boundary of the installation slot 12 and the film layer are spaced apart by a certain distance, the effect by cutting heat on the film layer during cutting is reduced, the film layer is prevented from being damaged by the cutting, and the manufacturing yield is improved.

In addition, evaporation and thin film packaging of the organic unit are performed after the cutting and slotting, so that the edge of the package layer 13 is prevented from absorbing a large amount of heat and having damage such as expansion or tearing in the subsequent cutting process, thereby preventing the organic light-emitting unit from being invaded by air or water vapor outside the closed space, and the display effect and the service life of the display panel are improved.

FIG. 3 is a cross-sectional view of a display panel without a package layer according to an embodiment. FIG. 4 is a cross-sectional view of the display panel shown in FIG. 3 with a package layer. For the purpose of explanation, only a part of the structure relevant to the embodiment is shown.

The display panel includes an array substrate 10, an organic light-emitting unit 11, and a package layer 13. The array substrate 10 includes a base substrate 16 and a plurality of film layers. The base substrate 16 is provided with an installation slot 12 to provide an installation space for the hardware structure, and the plurality of film layers are provided with a packaging-reserved slot 14 extending through at least a part of the film layers of the array substrate 10. The installation slot 12 extends through the base substrate 16 in a thickness direction of the array substrate 10, and the packaging-reserved slot 14 is defined around the installation slot 12.

The organic light-emitting unit 11 is formed on the array substrate 10, and is located outside the installation slot 12 and the packaging-reserved slot 14. The package layer 13 is formed on a side of the organic light-emitting unit 11 away from the array substrate 10. The packaging-reserved slot 14 is provided with package layer material with a preset thickness covering at least the organic light-emitting unit 11 adjacent to an edge of the installation slot 12. In this way, the package layer material with the preset thickness can cover at least sides of the organic light-emitting unit 11, and together with the package layer 11, ensures the organic light-emitting unit 11 is not invaded and damaged, thereby improving the packaging reliability of the display panel.

In some embodiments, the array substrate includes a base substrate 16, a thin film transistor provided on the base substrate 16, and an anode 18 and a functional film layer provided on the thin film transistor. The functional film layer includes at least a pixel defining layer. The packaging-reserved slot 14 extends through at least the functional film layer. The installation slot extends through the base substrate 16 and the film layers on the array substrate in a thickness direction of the base substrate 16. The package layer material covers at least the functional film layer and an organic light-emitting unit 11 adjacent to an edge of the installation slot. In this way, it is further ensured that the organic light-emitting material layer or the like in the organic light-emitting unit is not invaded by outside environment.

Figure 5:
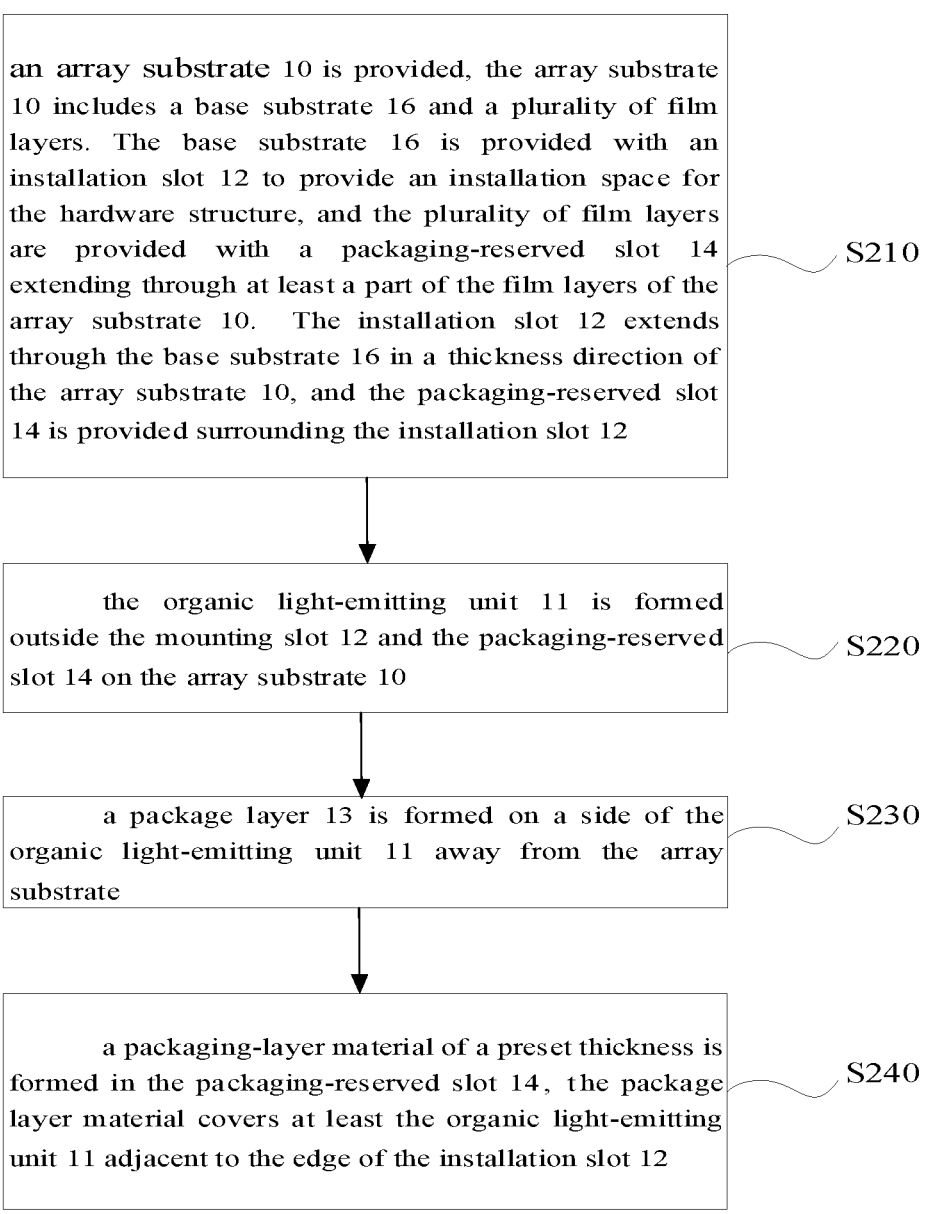
FIG. 5 is a flowchart of a manufacturing method of a display panel according to an embodiment.

FIG. 5 is a flowchart of a manufacturing method of a display panel according to an embodiment. Referring to FIG. 5, the present embodiment provides a manufacturing method of a display panel, which includes the following steps:

In step S210, an array substrate 10 is provided.

The array substrate 10 includes a base substrate 16 and a plurality of film layers. The base substrate 16 is provided with an installation slot 12 to provide an installation space for the hardware structure, and the plurality of film layers are provided with a packaging-reserved slot 14 extending through at least a part of the film layers of the array substrate 10. The installation slot 12 extends through the base substrate 16 in a thickness direction of the array substrate 10, and the packaging-reserved slot 14 is provided surrounding the installation slot 12.

The packaging-reserved slot 14 is providing a covering space for a package layer material, so that the packaging material protects the organic light-emitting units adjacent to an edge of the installation slot 12 when a package layer is formed. In some embodiments, the packaging-reserved slot 14 may be obtained by performing a pattern hollowing process at the time of forming the film layer. In other embodiments, the packaging-reserved slot 14 can also be formed by chemically or physically removing the corresponding film layers, for example, by an etching process to remove the film layers corresponding to the packaging-reserved slot 14.

In some embodiments, the array substrate includes a base substrate 16, a thin film transistor provided on the base substrate 16, and an anode 18 and a functional film layer provided on the thin film transistor. Referring to FIG. 1, the functional film layer includes at least a pixel defining layer 19. The pixel defining layer 19 includes a plurality of pixel defining openings 15 to provide organic light-emitting units. The packaging-reserved slot 14 may be obtained by performing a pattern hollowing process while forming the pixel defining layer 19. During the cutting process, a laser may be used to cut the installation slot 12 in a slotted region to make the installation slot 12 to extend through the base substrate 16 and the film layers of the array substrate in a direction perpendicular to the base substrate 16.

The described packaging-reserved slot 14 is defined between an edge of the installation slot 12 and an boundary of the functional film layer adjacent to the installation slot 12. That is, in the subsequent formation of the package layer, the packaging material may cover the pixel defining layer 19 and the organic light-emitting unit adjacent to the edge of the installation slot 12, thereby protecting the organic light-emitting unit from being invaded by water and oxygen from outside, which improves the reliability at the installation slot 12.

In step S220, the organic light-emitting unit 11 is formed outside the installation slot 12 and the packaging-reserved slot 14 on the array substrate 10.

The organic light-emitting unit 11 includes at least an organic light-emitting material layer and a cathode layer formed on the organic light-emitting material layer. In some embodiments, the organic light-emitting material layer may have a multi-layer structure, for example, in addition to an light-emitting layer, it may include an electron transport layer and a hole transport layer that balance electrons and holes enhance an injection of electrons and holes.

The array substrate has a plurality of pixel regions, and each pixel region may include a plurality of sub-pixel regions. For example, in some embodiments, one pixel region may include a sub-pixel region that emits red light, a sub-pixel region that emits green light, and a sub-pixel region that emits blue light. The organic light-emitting unit 11 is one pixel including a plurality of sub-pixels. In a specific fabrication process, a fine metal mask may be used to evaporate the light-emitting layers that emit red, green and blue light to the corresponding sub-pixel regions.

In some embodiments, the pixel defining layer 19 has a plurality of pixel defining openings 15, each pixel defining open 15 is configured to define a corresponding pixel. The pixel defining opening 15 includes a plurality of sub-openings, and the corresponding sub-pixels are provided in the corresponding sub-openings. In specific manufacture, the organic light-emitting unit 11 is formed by evaporation in the pixel defining opening 15, and the mask in a slotted region and the packaging-reserved slot 14 is not holed, that is, an OLED material is not evaporated in the slotted region and the packaging-reserved slot 14.

In step S230, a package layer 13 is formed on a side of the organic light-emitting unit 11 away from the array substrate.

In step S240, a package layer material with a preset thickness is formed in the packaging-reserved slot 14. The package layer material covers at least the organic light-emitting unit 11 adjacent to the edge of the installation slot 12.

The package layer 13 is formed on the side of the organic light-emitting unit 11 away from the array substrate, that is, on a top surface of the organic light-emitting unit 11, and can block air and water vapor for the organic light-emitting unit 11. It is understandable that since the organic light-emitting material layer is very sensitive to the external environment such as water vapor and oxygen, if the organic light-emitting material layer in the display panel is exposed to an environment having water vapor or oxygen, the performance of the display panel may be drastically decreased or completely damaged. The package layer material with a preset thickness is provided in the packaging-reserved slot 14 and covers at least the organic light-emitting unit 11 adjacent to the edge of the installation slot 12, so that the side of the organic light-emitting unit 11 adjacent to the edge of the installation slot 12 is also covered, which improves the reliability of the packaging of the organic light-emitting unit 11. In specific manufacture, the package layer 13 may be formed using thin film packaging on the array substrate on which the organic light-emitting unit 11 has been evaporated, and the slotted region is not packaged, thereby exposing the installation slot 12.

It is understood that the package layer 13 may be of one or more layers, may be an organic film layer or an inorganic film layer, or may be a stacked structure of organic film layer(s) and inorganic film layer(s). For example, in one or more embodiments, the package layer 13 may include two inorganic film layers and one organic film layer located therebetween.

It can be understood that the packaging-reserved slot 14 is configured to accommodate the package layer material, and the package layer material may completely cover the film layers adjacent to the edge of the installation slot 12, or partially cover the film layers adjacent to the edge of the installation slot 12, and there is no limitation hereto. However, it should be noted that the package layer material located in the packaging-reserved slot 14 should cover at least the organic light-emitting unit 11 so as to cooperate with the package layer to ensure that the organic light-emitting material layer or the like in the organic light-emitting unit 11 is not invaded by outside environment.

According to the manufacturing method of the display panel provided in the embodiment of the present disclosure, before the organic light-emitting unit 11 is deposited on the array substrate 10, cutting and slotting are performed on the array substrate 10 so as to avoid damage to the organic light-emitting unit 11 by the cutting heat, the production yield of the display panel is thereby improved. In addition, evaporation and thin film packaging of the organic light-emitting unit 11 are performed after cutting and slotting, so that the edge of the package layer 13 is prevented from absorbing a large amount of heat and having damage such as expansion or tearing in the subsequent cutting process, thereby preventing the organic light-emitting unit 11 from being invaded by air or water vapor outside the closed space, and the display effect and the service life of the display panel are improved.

In addition, the array substrate is provided with the packaging-reserved slot 14, so that the package layer material can be coated at least on the organic light-emitting unit 11, so that the packaging reliability of the display panel is further improved.

Based on the described display panel, an embodiment of the present disclosure also provides a display device. In some embodiments, the display device may be a display terminal, such as a tablet computer. In other embodiments, the display device may also be a mobile communication terminal, such as a mobile terminal.

In some embodiments, the display device includes a display panel and a control unit configured to transmit a display signal to the display panel.

In summary, according to the array substrate and the manufacturing method thereof, the display panel and the manufacturing method thereof, and the display device provided in the embodiments of the present disclosure, before the organic light-emitting unit is deposited on the array substrate, cutting and slotting are performed on the array substrate so as to avoid damage to the organic light-emitting unit by the cutting heat, the production yield of the display panel is thereby improved. In addition, evaporation and thin film packaging of the organic unit are performed after cutting and slotting, so that the edge of the package layer 13 is prevented from absorbing a large amount of heat and having damage such as expansion or tearing in the subsequent cutting process, thereby preventing the organic light-emitting unit from being invaded by air or water vapor outside the closed space, and the display effect and the service life of the display panel are improved. Furthermore, the array substrate is provided with the packaging-reserved slot 14 thereon, so that the package layer material can be at least coated on the organic light-emitting unit, thereby further improving the packaging reliability of the display panel.

In some embodiments, the packaging material and the package layer material are of the same material.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing embodiments are merely specific implementations of the present disclosure, and the description thereof is more specific and detailed, and are not intended to limit the protection scope of the present disclosure. It should be noted that any variation or replacement readily figured out by persons skilled in the art without departing from the spirit and scope of the present disclosure shall all fall into the protection scope of the present disclosure. Therefore, the protection scope of the present disclosure shall be determined by the appended claims.

The invention claimed is:

1. An array substrate comprising:
   a base substrate;
   an installation slot positioned in the base substrate for providing an installation space, the installation slot extending through a thickness of the base substrate, the installation slot separating the base substrate into two or more pixel regions; and
   an anode layer and a pixel defining layer provided in each pixel region on the base substrate, wherein the pixel defining layer includes a plurality of pixel defining openings, and wherein the pixel defining layer includes a packaging-reserved slot extending through at least a part of the pixel defining layer, the packaging-reserved slot being positioned around the installation slot.

2. The array substrate according to claim 1, further comprising an organic light-emitting unit in the pixel defining opening, the organic light-emitting unit including an organic light-emitting material layer and a cathode layer formed on the organic light-emitting material layer.

3. The array substrate according to claim 2, wherein a top surface of the organic light-emitting unit is planar with a top surface of the pixel defining layer.

4. The array substrate according to claim 1,
wherein a width of the packing reserve slot is greater than a width of the installation slot.

5. The array substrate according to claim 2, further comprising a package layer formed on a side of the organic light-emitting unit away from the array substrate, wherein the package layer covers at least the organic light-emitting unit adjacent to an edge of the installation slot.

6. The array substrate according to claim 4, wherein an edge of the installation slot and a boundary of the functional film layer define the packaging-reserved slot; a shortest distance between the edge of the installation slot and the boundary of the functional film layer is substantially 80 μm to substantially 150 μm.

7. The array substrate according to claim 6, wherein a shortest distance between the edge of the installation slot and the boundary of the functional film layer is substantially 100 μm.

* * * * *